(12) United States Patent  (10) Patent No.: US 7,734,992 B2
Arima  (45) Date of Patent: Jun. 8, 2010

(54) PATH MEMORY CIRCUIT

(75) Inventor: Yukio Arima, Osaka (JP)

(73) Assignee: Panasonic Corporation, Osaka (JP)

(*) Notice: Subject to any disclaimer, the term of this patent is extended or adjusted under 35 U.S.C. 154(b) by 894 days.

(21) Appl. No.: 10/593,280

(22) PCT Filed: Dec. 7, 2004

(86) PCT No.: PCT/JP2004/018194

§ 371 (c)(1),
(2), (4) Date: Sep. 18, 2006

(87) PCT Pub. No.: WO2005/101669

PCT Pub. Date: Oct. 27, 2005

(65) Prior Publication Data

US 2007/0177687 A1 Aug. 2, 2007

(30) Foreign Application Priority Data

Apr. 7, 2004 (JP) ............................. 2004-112786

(51) Int. Cl.
*H03M 13/03* (2006.01)
(52) U.S. Cl. ..................... 714/795; 704/242; 375/262
(58) Field of Classification Search .................. 714/792, 714/795, 796; 375/265, 341, 262; 704/242
See application file for complete search history.

(56) References Cited

U.S. PATENT DOCUMENTS

| 5,272,706 | A  | * | 12/1993 | Park ............................ 714/795 |
| 5,432,820 | A  | * | 7/1995  | Sugawara et al. ........... 375/341 |
| 6,259,749 | B1 | * | 7/2001  | Andoh ......................... 375/341 |
| 6,615,388 | B1 | * | 9/2003  | Takamichi ................... 714/795 |
| 2001/0049809 | A1 | * | 12/2001 | Miyauchi et al. ............ 714/796 |

FOREIGN PATENT DOCUMENTS

| JP | 61-75935 A   | 4/1986 |
| JP | 63-166332 A  | 7/1998 |
| JP | 10-302412 A  | 11/1998 |
| JP | 2001-144633 A | 5/2001 |
| JP | 2002-368628 A | 12/2002 |

* cited by examiner

*Primary Examiner*—Sam Rizk
(74) *Attorney, Agent, or Firm*—McDermott Will & Emery LLP

(57) ABSTRACT

A path memory circuit for use in a Viterbi decoding process performed based on state transitions through a number n (n is a positive integer) of states. The path memory circuit includes a memory area A formed by the storage circuits of the first to $i^{th}$ (i is an integer from 0 to M) stages; a memory area B formed by the selective storage circuits that select and hold a decoding result for any state k (k is integer from 1 to n) of the storage circuits from the i+$1^{th}$ stage to the $M^{th}$ stage; and a memory area C formed by the selective storage circuits other than the memory area A and the memory area B.

14 Claims, 11 Drawing Sheets

US 7,734,992 B2
PATH MEMORY CIRCUIT

RELATED APPLICATIONS

This application is the U.S. National Phase under 35 U.S.C. §371 of International Application No. PCT/JP2004/018194, filed on Dec. 7, 2004, which in turn claims the benefit of Japanese Application No. 2004-112786, filed on Apr. 7, 2004, the disclosures of which Applications are incorporated by reference herein.

TECHNICAL FIELD

The present invention relates to a path memory circuit used in Viterbi decoding for storing survivor path information of each state, which is used in the read channel of communications systems, optical discs and magnetic disks.

BACKGROUND ART

Viterbi decoding is a technique used for a received data stream that has been encoded by a particular convolution, and assumes the most likely data based on the rules of the convolution to thereby decode the received data stream. The convolution rules can be expressed as a state transition diagram. With the concept of time taken into consideration in addition to the state transition diagram, they can be expressed as a trellis diagram.

FIG. 1 shows an example of a convolutional encoder, and FIG. 2 shows a trellis diagram thereof. In FIG. 1, reference numerals 81 and 82 denote delay elements, and 83 and 84 denote adders. The delay elements 81 and 82 each hold a value from one time segment ago. In FIG. 2, k denotes the time. Thus, FIG. 2 shows the state transition from time k−1 to time k, and that from time k to time k+1. In FIG. 2, S0 to S3 are state numbers in the state transitions. Each line is called a branch extending from one state to another state, the transition to which is possible.

In Viterbi decoding, in order to evaluate the likelihood (probability) of each transition from each state, the branch metric is calculated for each branch by using an evaluation function. Since the start of a decoding process, each state stores the cumulative branch metric of the most likely one of the branches leading to the state. This is called a path metric. Normally, a branch metric is calculated as the square error between the ideal value and the actually received value, and it is determined that the most likely branch is the one for which the addition between the path metric at time k−1 and the branch metric at time k yields the smallest value.

A path memory circuit holds an ideal value that takes a transition represented by the most likely branch at each time segment, and shifts the value to subsequent stages over time. At the time of the shift operation, each storage circuit selects and holds a value from a storage element circuit of a preceding stage along the most likely branch. For example, if at a given point in time the most likely branch for S0 is the branch for a transition thereto from S1, then, M0(i)=M1(i−1). In the expression, M0(x) is the value of the memory in the $x^{th}$ stage for state 0, M1(x) is the value of the memory in the $x^{th}$ stage for state 1, and i is an integer in the range from 1 to the number of path memory stages minus 1.

A path, obtained through such a process, that extends through the most likely branches at different points in time is called a survivor path. While each state in a trellis diagram has its survivor path, the survivor paths of all states converge into a single path as the decoding process proceeds. Similarly, as the shift operation proceeds, the values of the path memory circuit for each state converge into a single value. The obtained single survivor path is the final decoding result of the Viterbi decoding process.

As can be seen from the above description, a sufficient number of memory stages (memory length) of a path memory circuit is such a number that it is possible to hold all data occurring until the decoded results converge into one. However, the amount of time required until the convergence occurs varies depending not only on the encoding scheme and the application, but also on other environmental factors such as the temperature and the noise, and it is not possible to uniquely determine such an amount of time. Therefore, a conventional path memory circuit for Viterbi decoding employs a large memory length taking environmental variations into consideration. This increases the circuit scale and the power consumption.

In view of this, another type of path memory circuits are widely proposed in the art, in which the memory length can be changed according to the status of the decoding process (see Patent Document 1 and Patent Document 2). For example, in a path memory circuit having a memory length of M (M is a positive integer) stages as shown in FIG. 3, the operation of the storage element circuits of the $j^{th}$ and subsequent stages may be stopped depending on how the decoding results are converging. Here, j is an integer where $0<j\leq M$. In FIG. 3, reference numeral 20 denotes a selection circuit for selecting an input signal according to the most likely branch determined for each state, reference numeral 21 denotes a storage element circuit for holding the output from the selection circuit 20, reference numeral 22 denotes a selective storage circuit, reference numeral 23 denotes a stage of storage circuit, and reference numeral 24 denotes an output selection circuit.

When receiving a memory length control signal, which instructs to stop the $j^{th}$ and subsequent storage circuits 23, the operation of the $j^{th}$ and subsequent storage circuits 23 is stopped by, for example, stopping the supply of the clock signal thereto. In order to normally take out the output from the path memory circuit, the output selection circuit 24 selectively outputs the output of the storage circuit 23 of the $j-1^{th}$ stage according to the memory length control signal. Thus, the path memory circuit of FIG. 3 can operate by operating only the $j-1^{th}$ storage circuit 23, thereby cutting down the power consumption of M−j+1 storage circuits 23.

There is also a known approach in which the input stage to the path memory circuit is selected by allowing for early stages, instead of later stages, of the path memory circuit to be stopped (see Patent Document 3).

Patent Document 1: Japanese Laid-Open Patent Publication No. 63-166332

Patent Document 2: Japanese Laid-Open Patent Publication No. 10-302412

Patent Document 3: Japanese Laid-Open Patent Publication No. 2002-368628

DISCLOSURE OF THE INVENTION

Problems to be Solved by the Invention

Thus, there have been proposed approaches in which the memory length of the path memory circuit is made variable in order to solve the power consumption problem of path memory circuits, but there still remains the problem of the increase in the circuit scale. In the configuration shown in FIG. 3, if the operation of the $j^{th}$ and subsequent storage circuits 23 is stopped, it is necessary, for taking out the output of the path memory circuit, to provide means for taking out the output from the j−1$^{th}$ stage and selecting one of the output from the M$^{th}$ stage and that from the j−1$^{th}$ stage. As the number of stages that can be stopped increases, there will be an increased number of wires and an increased number of selectors for taking out a selected output.

An object of the present invention is to reduce the power consumption and the circuit scale of a path memory circuit.

Means for Solving the Problems

With a path memory circuit of the present invention, it is possible, using a control signal, to stop the operation of the storage element circuits of the i+1 (i is an integer where 0<i<M)$^{th}$ and subsequent stages. The path memory circuit is divided into memory areas A, B and C, wherein the memory area B includes those of the storage element circuits of the i+1$^{th}$ and subsequent stages that hold data regarding a certain state, and the memory area C includes those of the storage element circuits of the i+1$^{th}$ and subsequent stages that do not belong to the memory area B, with the memory area A including the remaining storage element circuits. When the storage element circuits of the j (j is an integer where i<j≦M)$^{th}$ and subsequent stages are stopped, the j$^{th}$ and subsequent stages in the memory area C are stopped, while the j$^{th}$ and subsequent stages in the memory area B are controlled so that the storage element circuits belonging to the memory area B function as shift registers.

Effects of the Invention

Thus, with the path memory circuit of the present invention, even when the storage element circuits of the j$^{th}$ and subsequent stages are stopped, it is possible to obtain the path memory output without adding a bus wire for taking out an output from each stage or a selector for selecting the output, thereby being significantly effective in reducing the power consumption of the path memory circuit and in reducing the circuit scale.

DESCRIPTION OF REFERENCE NUMERALS

Figure 1:
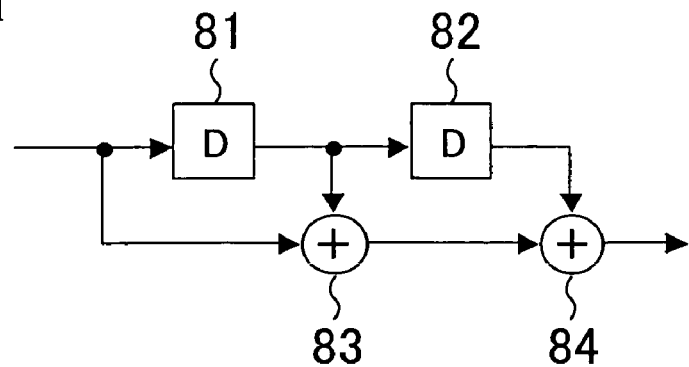
FIG. 1 is a block diagram showing a configuration of a typical convolutional encoder.

1 Memory area A
2 Memory area B
3 Memory area C
10, 20 Selection circuit
11, 21 Storage element circuit
12, 22 Selective storage circuit
13, 23 Storage circuit
14 Repeater-type selective storage element circuit
15 Synchronized-type selective storage element circuit
16 Clock control circuit
17 Scan path
18 Operation mode control circuit
24 Output selection circuit
31 Synchronization pulse producing circuit
32 Data holding circuit
41 Synchronization signal producing circuit
42 Master storage circuit
43 Slave storage circuit
51 Synchronization pulse producing circuit
52 Driver circuit
61 Convergence determination circuit
62 Logical sum circuit
71 Memory length setting unit
72 Logical sum circuit
81, 82 Delay element
83, 84 Adder
101 Selection circuit
102 Data holding circuit

BEST MODE FOR CARRYING OUT THE INVENTION

For the purpose of illustration, the following description will be directed to a Viterbi decoder for decoding a data stream that has been encoded by the convolutional encoder shown in FIG. 1. The state transitions of this encoder will be as represented by the trellis transition diagram of FIG. 2.

First Embodiment

Figure 4:
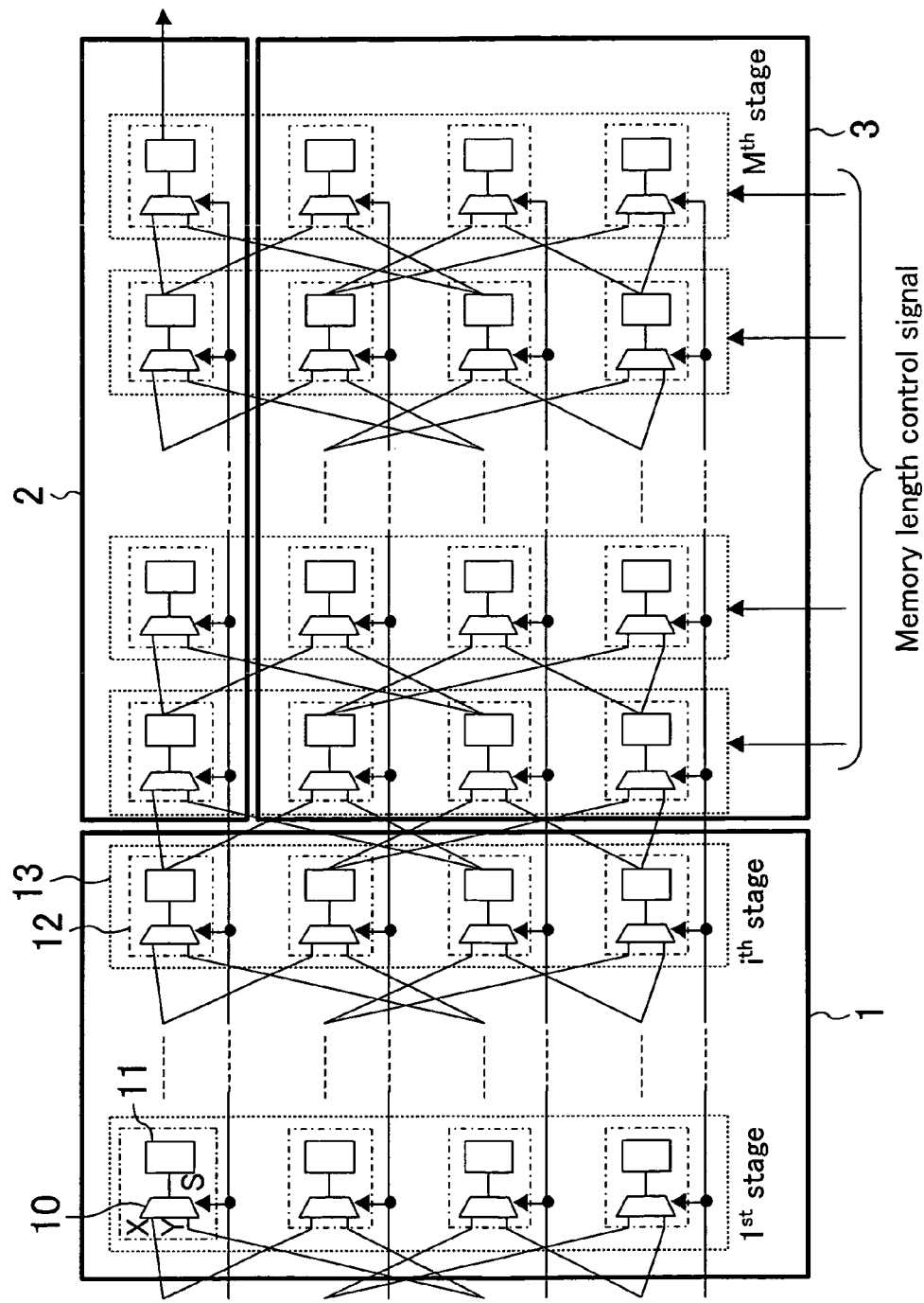
FIG. 4 is a block diagram showing a path memory circuit according to a first embodiment of the present invention.

FIG. 4 shows a path memory circuit of the present invention. In FIG. 4, reference numeral 1 denotes the memory area A, reference numeral 2 denotes the memory area B, reference numeral 3 denotes the memory area C, reference numeral 10 denotes a selection circuit, reference numeral 11 denotes a storage element circuit, reference numeral 12 denotes a selective storage circuit, and reference numeral 13 denotes a stage of storage circuit. A selective storage circuit 12 includes the selection circuit 10 for selecting and outputting one input signal depending on a signal that indicates the most likely branch as determined by Viterbi decoding for each state, and the storage element circuit 11 for holding the outputted signal in synchronism with a clock signal. The storage circuit 13 includes the selective storage circuits 12 for all the states belonging to the same stage.

The maximum memory length of the path memory circuit shown in FIG. 4 is M, and the constraint length thereof is 3 (thus, the number of states is 4). Therefore, the total number of the selective storage circuits 12 is 4 M.

The memory area A is an area including the selective storage circuits 12 for all the states up to the $i^{th}$ stage, which are needed when the Viterbi decoding results converge at the earliest point in time. The memory area B is an area including those for state 0, among the selective storage circuits 12 from the $i+1^{th}$ stage to the $M^{th}$ stage. The memory area C is an area including all the other selective storage circuits 12. The selection circuits 10 and the storage element circuits 11 belonging to the memory area A and the memory area C may be ordinary selectors and ordinary flip-flops or latches, respectively. In contrast, the selection circuits 10 belonging to the memory area B need to be controlled so that it selects an input coming from those of the selective storage circuits 12 of the preceding stage that belong to the memory area B when the operation thereof is stopped. The storage element circuits 11 of the memory area B can be ordinary flip-flops or latches.

How to stop the operation of the storage circuits 13 of the $j^{th}$ and subsequent stages will now be described. When a memory length control signal, instructing to stop the operation (it is assumed herein that the memory length control signal is instructing an operation stop when it is at H), is inputted to the storage circuits 13 of the $j^{th}$ and subsequent stages, the circuits from the $i+1^{th}$ stage to the $j-1^{th}$ stage in the memory area B operate normally while the selection circuits 10 of the $j^{th}$ and subsequent stages always select the output from the selective storage circuit 12 of state 0 (the X input in FIG. 4). This function can easily be realized by a logical operation between the select signal (the S input in FIG. 4) of the selection circuit 10 and the memory length control signal. With the selection circuits 10 always selecting the X input, the selective storage circuits 12 of the $j^{th}$ and subsequent stages in the memory area B each shift an output from the preceding stage to the following stage as does a shift register. Thus, as the output of the path memory circuit, the output signal of the storage circuit 13 of the $j-1^{th}$ stage is outputted.

In the memory area C, the circuits from the $i+1^{th}$ stage to the $j-1^{th}$ stage operate normally, and those of the $j^{th}$ and subsequent stages stop operating. A commonly known method of stopping the operation is to stop the supply of the clock signal. Stopping the operation of the selective storage circuits 12 by stopping the supply of the clock signal can be realized by providing a separate wire for each stage for supplying the clock signal to the memory area C, wherein a clock signal can be fixed to L or H when the corresponding memory length control signal is at H.

A back bias may be applied to the substrate of transistors forming circuits of the stage where the memory length control signal is at H. In this way, it is possible to reduce the leak current, and it is thus possible to further reduce the power consumption. Alternatively, a separate power source may be provided for each stage, whereby it is possible to stop the power supply itself to circuits of the stage whose operation is being stopped.

Figure 5:
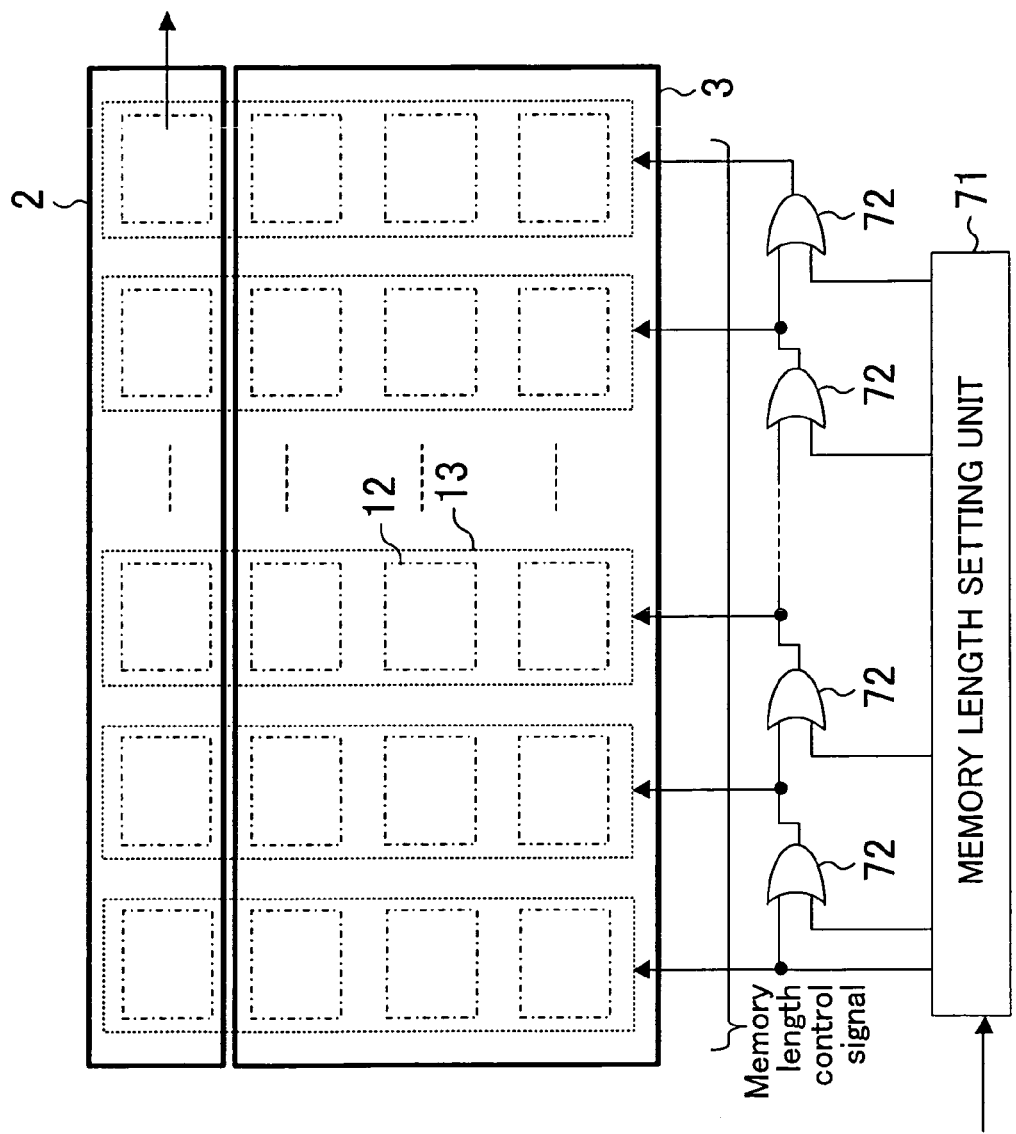
FIG. 5 is a block diagram showing an example of the production of the memory length control signal shown in FIG. 4.

Then, a method for producing the memory length control signal will be described. As disclosed in Patent Documents 1 and 2, identified above, a commonly known method is to determine the necessary memory length in view of external factors such as the amplitude level of signals to be inputted to the Viterbi decoder and the position of the disk reading head. FIG. 5 shows a memory length control circuit based on such a method. In FIG. 5, reference numeral 71 denotes a memory length setting unit, and reference numeral 72 denotes a logical sum circuit.

The memory length setting unit 71 receives an input representing external factors to estimate the optimal memory length based on the input, and then to output a memory length control signal according to the estimation results. The estimation method may take any of various embodiments depending on the application. In one embodiment, the method is to calculate the average input signal intensity and select one of pre-stored memory lengths based on the calculated value so as to output the memory length control signal. If the memory length control circuit determines that the decoding can be done with the memory length of j−1 stages, the memory length control signals to be inputted to the storage circuits 13 of the $j^{th}$ and subsequent stages are all controlled to H by the logical sum circuits 72.

Figure 6:
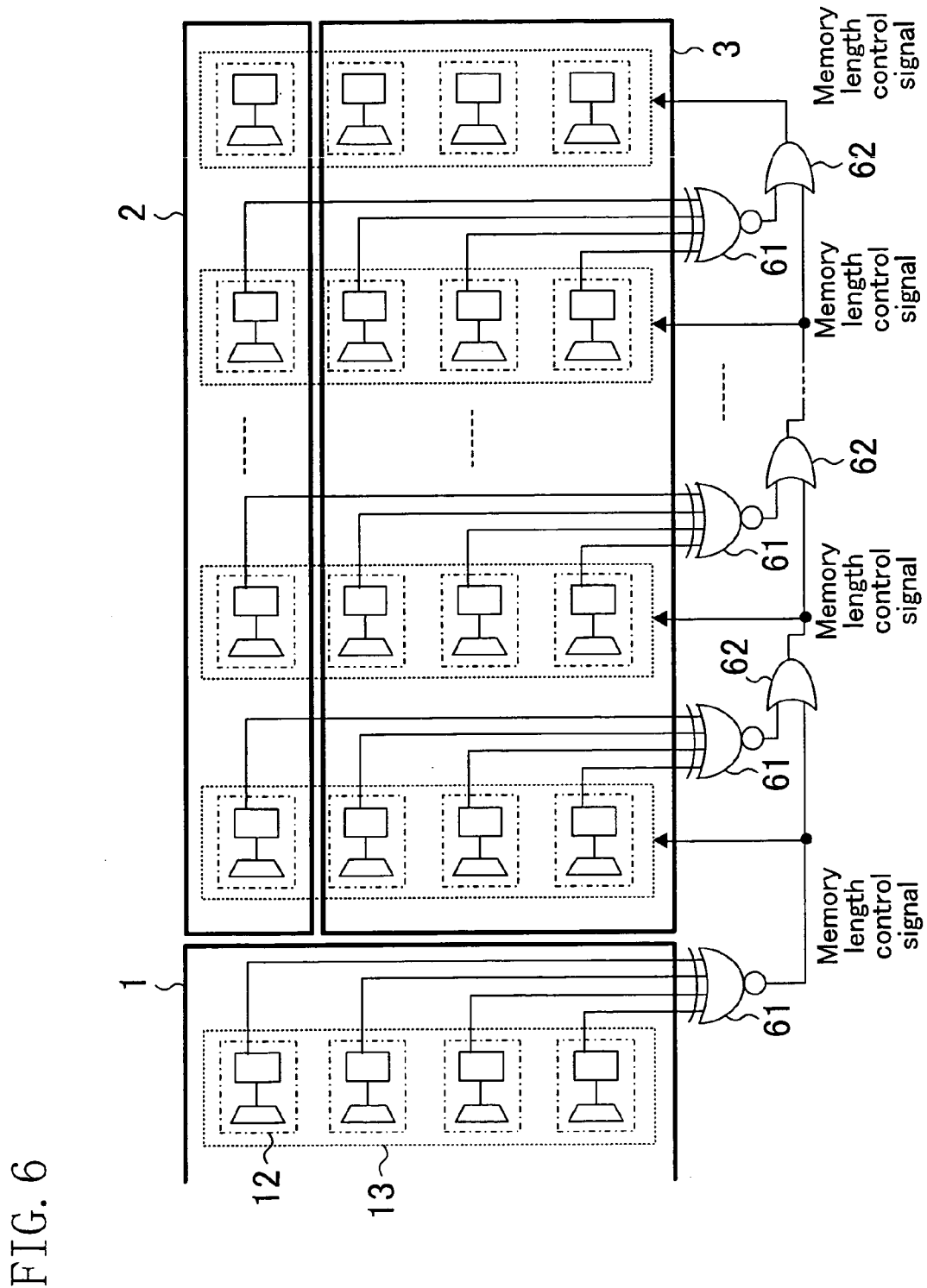
FIG. 6 is a block diagram showing another example of the production of the memory length control signal shown in FIG. 4.

Another method is to produce the memory length control signal in view of the progress of the Viterbi decoding. FIG. 6 shows a circuit configuration for such a case. In FIG. 6, reference numeral 61 denotes a convergence determination circuit for observing the outputs from all the selective storage circuits 12 for each stage so as to determine the Viterbi decoding results have converged. If data is properly decoded by Viterbi decoding, stored data for all states included in a stage of the path memory circuit converge into a single value. Therefore, the outputs of the selective storage circuits 12 are compared with one another for each stage, and the memory length control signal to be supplied to the following stage is set to H when the outputs are all the same. As in the case where external factors are referred to, if the memory length control signal of the preceding stage is at H, the memory length control signal of that stage is also set to H by the logical sum circuit 62. Thus, the memory length control signals will be at H for the stage next to the stage in which the decoding results have converged into one and the subsequent stages.

Second Embodiment

A second embodiment of the present invention will now be described. In the second embodiment, the storage element circuit 11 in the memory area B holds and outputs the input signal in synchronism with the clock signal when the memory length control signal is at L, and outputs the input signal as it is, irrespective of the clock signal, when the memory length control signal is at H. Thus, while it is necessary to provide separate clock wires for the memory area B and for the memory area C in the first embodiment, it is not necessary in the second embodiment. The storage element circuits 11 in the memory area C may be of the same configuration as those in the memory area B.

Figure 7:
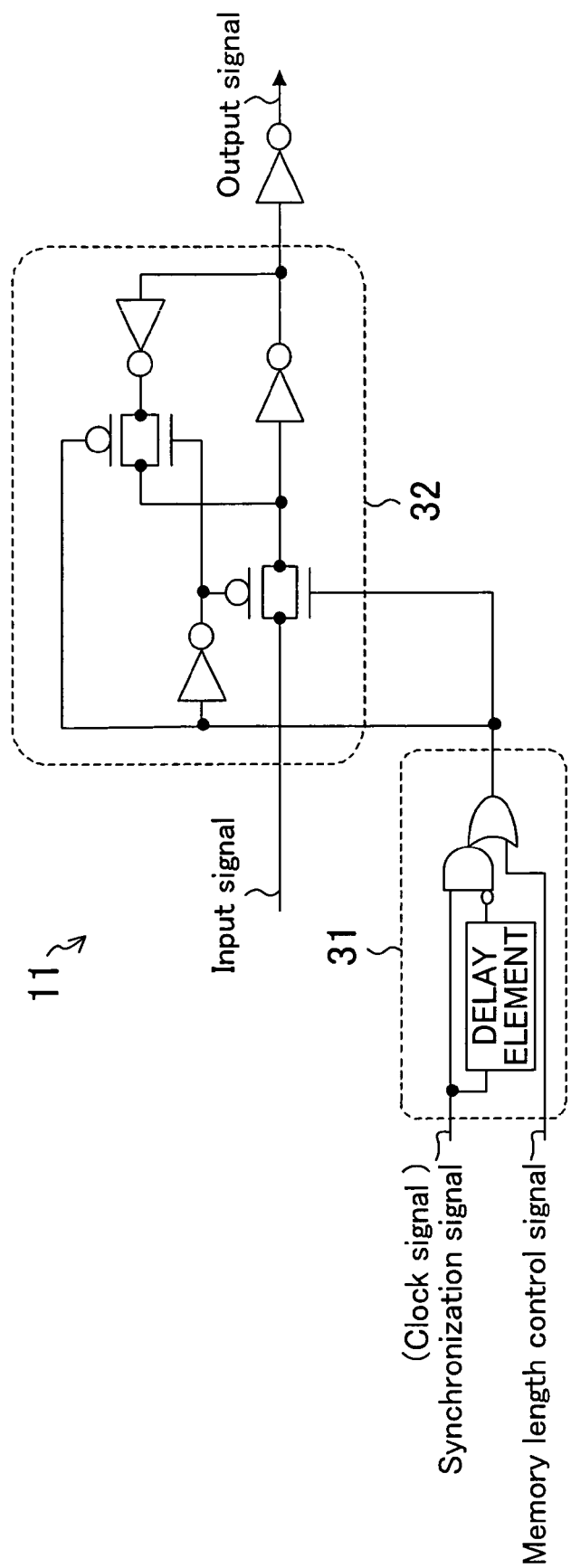
FIG. 7 is a circuit diagram showing an example of a configuration of a storage element circuit for a memory area B in a path memory circuit according to the second embodiment of the present invention.

FIG. 7 shows a configuration of the storage element circuit 11. In FIG. 7, reference numeral 31 denotes a synchronization pulse producing circuit, and reference numeral 32 denotes a data holding circuit. The synchronization pulse producing circuit 31 outputs a pulse in synchronism with the rising edge of the synchronization signal when the (memory length) control signal is at L, and outputs a signal fixed to H when the control signal is at H. The pulse width of the produced pulse signal is determined by the delay amount of the delay element in FIG. 7. The data holding circuit 32 takes in and outputs the input signal when the output signal of the synchronization pulse producing circuit 31 is at H, and holds and outputs data that has been taken in when it is at L.

Where a circuit of the configuration shown in FIG. 7 is employed as the storage element circuit 11, the clock signal and the memory length control signal supplied to the storage circuit 13 are inputted as the synchronization signal and the control signal, respectively, of FIG. 7, and the output signal of the selection circuit 10 is inputted as the input signal. Therefore, in the storage circuit 13 where the memory length control signal is at L, the storage element circuit 11 holds and outputs the output of the selection circuit 10 in synchronism with the clock signal. In the storage circuit 13 where the memory length control signal is at H, the output signal of the synchronization pulse producing circuit 31 is fixed to H, whereby the data holding circuit 32 is in a mode where it takes in and outputs the input signal, and thus the storage element circuit 11 outputs the output signal of the selection circuit 10 as it is. Since this output is done irrespective of the clock signal, it is possible to stop the supply of the clock signal to the storage circuit 13 where the memory length control signal is at H. In this way, it is possible to reduce the amount of power consumed in the synchronization pulse producing circuit 31, the buffer for driving the clock signal, etc.

Figure 8:
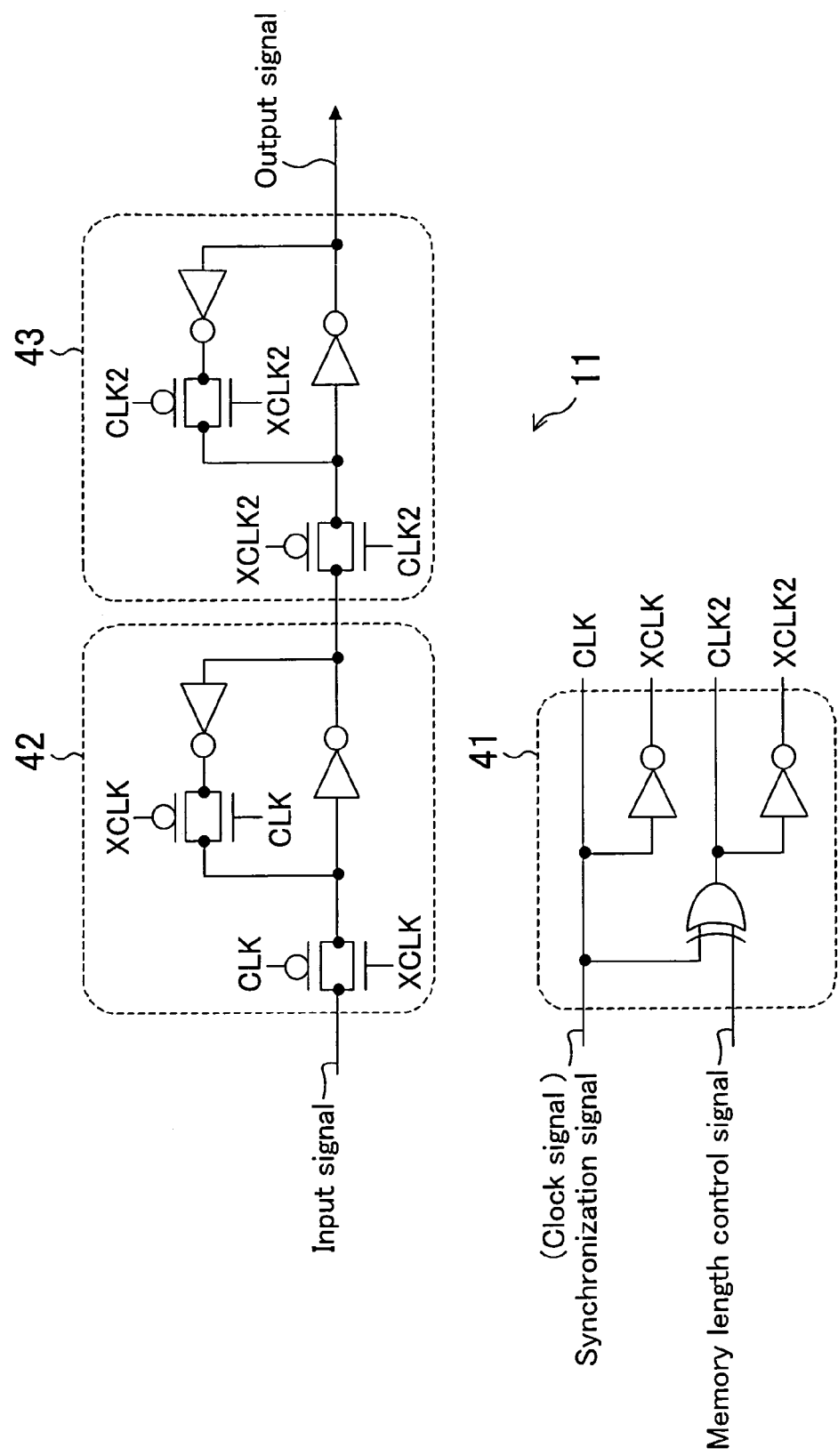
FIG. 8 is a circuit diagram showing a variation of the storage element circuit of FIG. 7.

FIG. 8 shows a different configuration of the storage element circuit 11 having a similar operation. In FIG. 8, reference numeral 41 denotes a synchronization signal producing circuit, reference numeral 42 denotes a master storage circuit, and reference numeral 43 denotes a slave storage circuit. The synchronization signal producing circuit 41 outputs the input synchronization signal, as it is, as the first synchronization signal CLK and the second synchronization signal CLK2, when the (memory length) control signal is at L. When the control signal is at H, the same signal as the synchronization signal is outputted as CLK, and the inverted signal of the synchronization signal is outputted as CLK2. Irrespective of the value of the control signal, XCLK and XCLK2 are the inverted signals of CLK and CLK2, respectively. In response to CLK, CLK2, XCLK and XCLK2 produced according to these rules, the master storage circuit 42 takes in and outputs the input signal when CLK is at L and holds and outputs data that has been taken in when CLK is at H. The slave storage circuit 43 takes in and outputs the output of the master storage circuit 42 when CLK2 is H, and holds and outputs data that has been taken in when CLK2 is at L.

Where a circuit of the configuration shown in FIG. 8 is employed as the storage element circuit 11, the clock signal and the memory length control signal supplied to the storage circuit 13 are inputted as the synchronization signal and the control signal, respectively, of FIG. 8, and the output signal of the selection circuit 10 is inputted as the input signal. Therefore, in the storage circuit 13 where the memory length control signal is at L, the storage element circuit 11 holds and outputs the output of the selection circuit 10 in synchronism with the clock signal. In the storage circuit 13 where the memory length control signal is at H, CLK and CLK2, which are output signals from the synchronization signal producing circuit 41, are reverse of each other. Then, if the clock supplied to the storage circuit 13 is fixed to L, CLK is fixed to L and CLK2 is fixed to H, whereby the master storage circuit 42 and the slave storage circuit 43 are each in a mode where it takes in and outputs the input signal, and thus the storage element circuit 11 outputs the output signal of the selection circuit 10 as it is.

Figure 9:
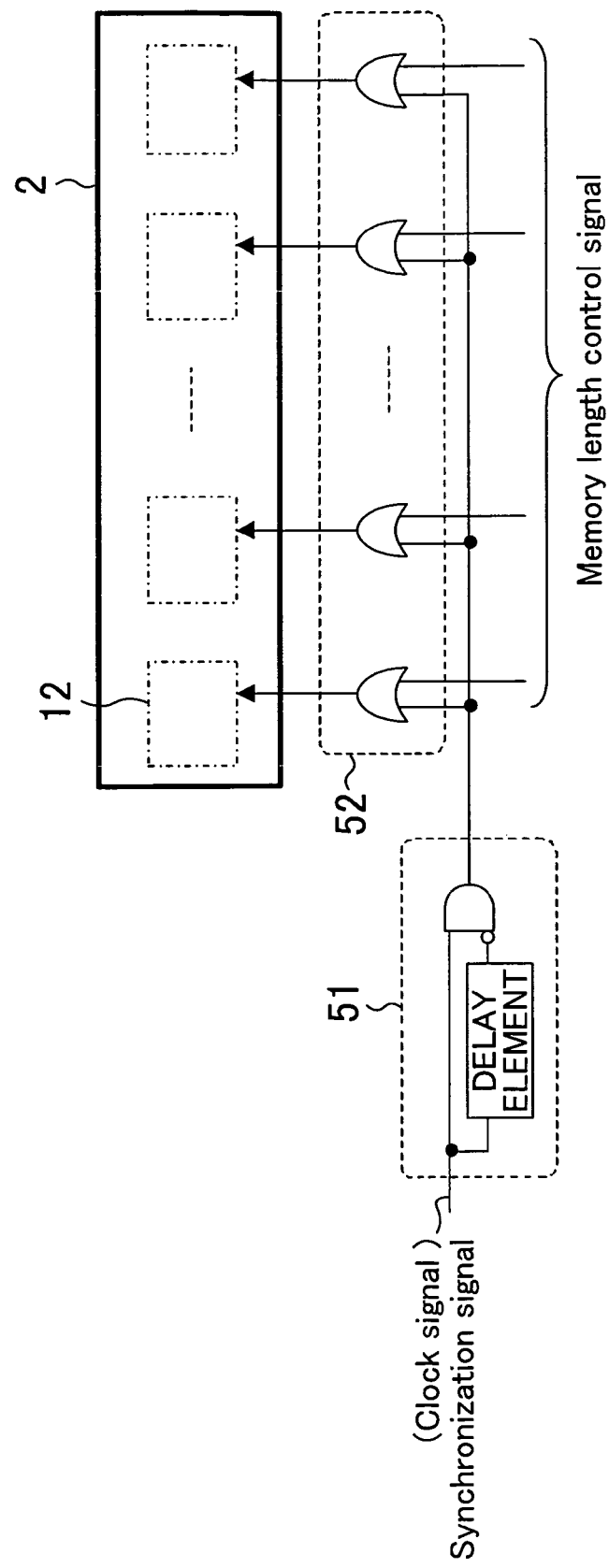
FIG. 9 is a circuit diagram showing a method for synchronizing the memory length control signal, as an alternative configuration to those shown in FIGS. 7 and 8.

Another configuration with a higher area efficiency will now be described. FIG. 9 shows the configuration. In FIG. 9, reference numeral 51 denotes a synchronization pulse producing circuit for producing a pulse signal in synchronism with the clock signal, and reference numeral 52 denotes a driver circuit for outputting a logical sum between the output of the synchronization pulse producing circuit 51 and the memory length control signal. Where the storage element circuit 11 shown in FIG. 7 is employed, there will be the same number of the synchronization pulse producing circuits 31 as the number of the storage element circuits 11. In contrast, in FIG. 9, an ordinary latch is used as a storage element circuit in each of the selective storage circuits 12, and pulse signals supplied thereto are produced by the single synchronization pulse producing circuit 51, thus reducing the power consumption and the area. The pulse signal produced by the synchronization pulse producing circuit 51 is supplied to the selective storage circuits 12 for each stage, after being subjected to a logical sum operation with the corresponding memory length control signal in the driver circuit 52. In this way, an operation as described above can be realized. While FIG. 9 only shows the memory area B, a similar structure may be employed for the memory area C. In such a case, a common pulse signal may be supplied to the memory area B and to the memory area C.

As is apparent from the description above, with any of the configurations shown in FIGS. 7, 8 and 9, when the storage circuits 13 of the $j^{th}$ and subsequent stages are stopped, the selective storage circuits 12 of the $j^{th}$ and subsequent stages in the memory area B will each repeat the output from the preceding stage to the following stage. Thus, as the output of the path memory circuit, the output signal of the storage circuit 13 of the $j-1^{th}$ stage will be outputted.

Except for what is specified in this section, the operation for the memory area A and the memory area C, the method for producing the memory length control signal, etc., are similar to those of the first embodiment.

Third Embodiment

Figure 10:
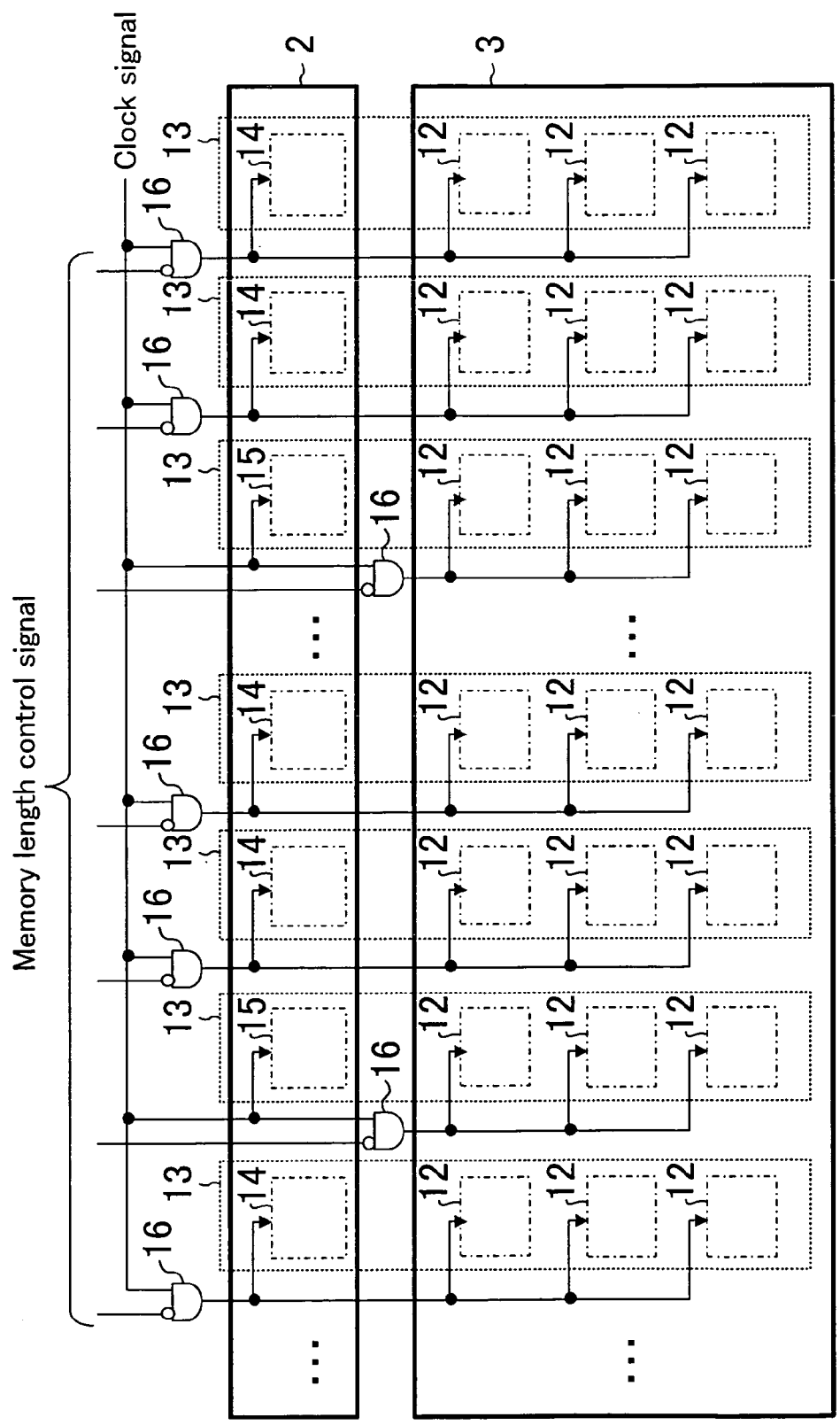
FIG. 10 is a block diagram showing a path memory circuit according to a third embodiment of the present invention.

FIG. 10 shows a configuration of a third embodiment. In FIG. 10, reference numeral 14 denotes a repeater-type selective storage element circuit, reference numeral 15 denotes a synchronous-type selective storage element circuit, and reference numeral 16 denotes a clock control circuit for controlling the clock signal according to the memory length control signal. While the repeater-type selective storage element circuit 14 is similar in structure to the selective storage circuit 12 described above, the storage element circuit 11 therein is a storage element circuit that outputs the input signal as it is, irrespective of the clock signal, when the memory length control signal is at H. While the synchronous-type selective storage element circuit 15 is similar in structure to the selective storage circuit 12 described above, the storage element circuit 11 therein is a storage element circuit that holds and outputs the input signal in synchronism with the clock signal when the memory length control signal is at H. The memory area A is not shown in FIG. 10.

In the third embodiment, a portion of the selective storage circuit belonging to the memory area B is the synchronous-type selective storage element circuit 15 with the remaining portion being the repeater-type selective storage element circuit 14. In an actual arrangement, the synchronous-type selective storage circuits 15 are provided at intervals of a certain number of stages. This number of stages can be determined as follows:

Interval of synchronous-type selective storage element circuits $15 \leq (Tc-Tl-To-Ts)/(Td+Tl)$ where Tc is the period of the clock signal inputted to the path memory circuit, Td is the output delay of the repeater-type selective storage element circuit 14, To is the output delay of the synchronous-type selective storage element circuit 15, Ts is the setup constraint, and Tl is the wire delay between selective storage circuits.

The clock control circuit 16 outputs the clock signal when the input memory length control signal is at L, and stops outputting the clock signal when it is at H. The output of the clock control circuit 16 is supplied to all the selective storage element circuits 14 and 12 in the memory area B and the memory area C for stages where the repeater-type selective storage element circuit 14 is used in the memory area B. For the synchronous-type selective storage element circuits 15, the output of the clock control circuit 16 is supplied only to the selective storage circuits 12 in the memory area C, and the original clock signal, which is not controlled by the clock control circuit 16, is inputted to the selective storage circuits in the memory area B (i.e., the synchronous-type selective storage element circuits 15).

With such a configuration, where the $j^{th}$ and subsequent stages are stopped by the memory length control signal, the synchronous-type selective storage element circuit 15 holds and outputs data in synchronism with the clock signal, and the repeater-type selective storage element circuit 14 outputs the input signal as it is, in the memory area B.

Thus, it is possible to minimize the amount of power to be consumed by the operation of the clock, while avoiding a problem that the output delay of the $j^{th}$ to $M^{th}$ stages, whose operation is to be stopped, exceeds the period of the operation clock, thus causing a timing error.

Figure 2:
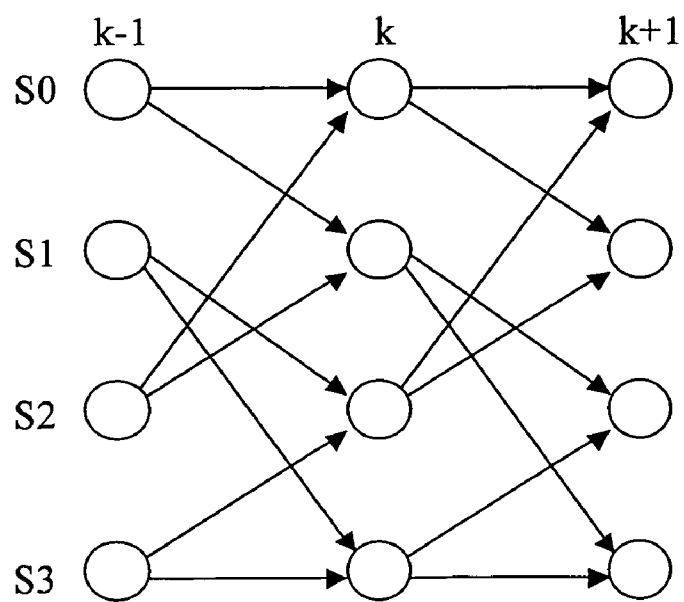
FIG. 2 is a trellis diagram of the convolutional encoder of FIG. 1.
Figure 3:
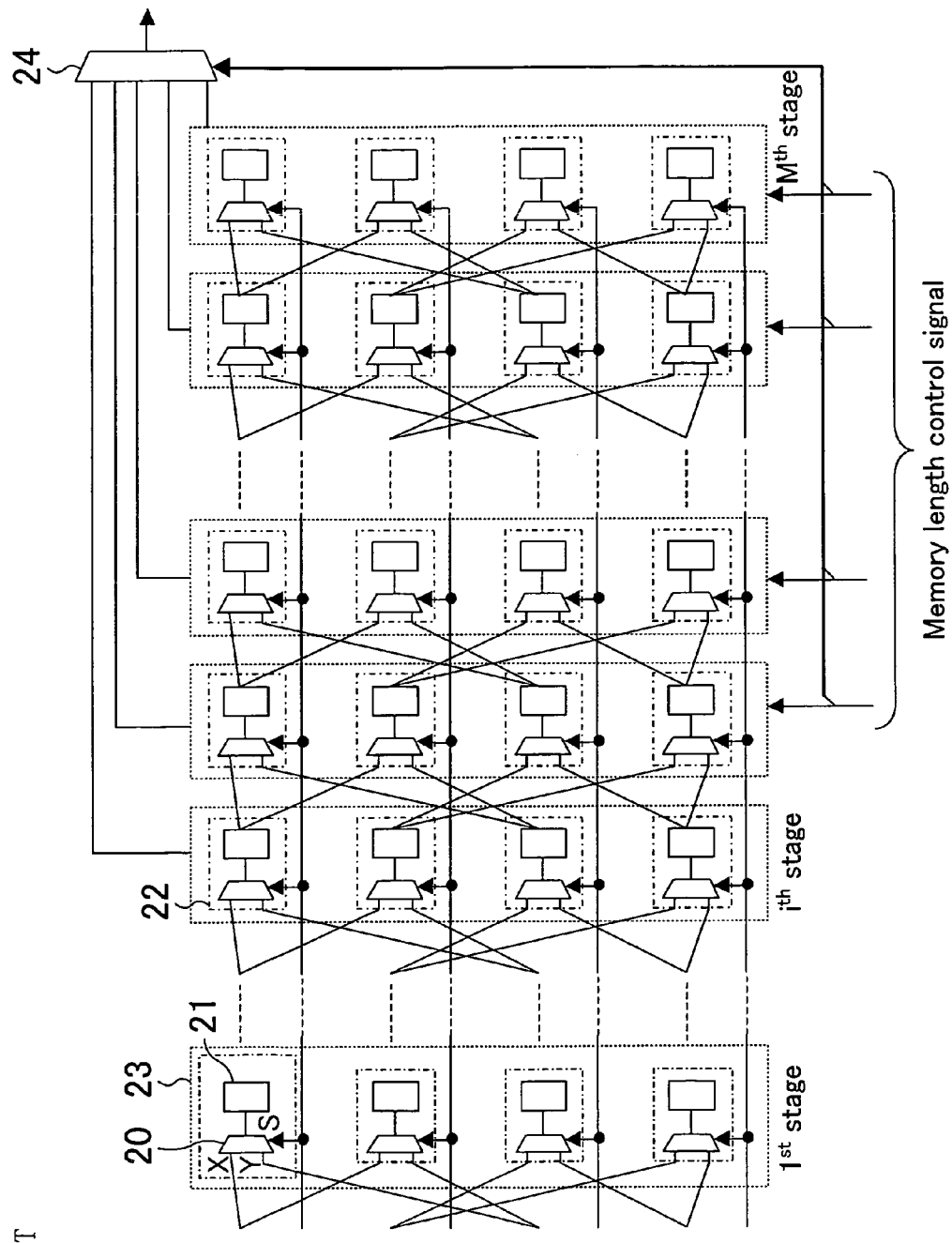
FIG. 3 is a block diagram showing a conventional path memory circuit with a variable memory length.

While the selective storage circuits 12 for any state may be used for the memory area B in the first and second embodiments described above, a most efficient configuration is a configuration that employs, for the memory area B, a group of the selective storage circuits 12 each being a selective storage circuit for a state having a state transition path to the same state. For example, in the trellis diagram shown in FIG. 2, state 0 (S0) and state 3 (S3), which have state transition paths to S0 and S3, respectively, are suitable for the memory area B. When such a state is employed for the memory area B, the selection circuit 10 is allowed to use an existing path, without creating a new special path for taking in the output from the selective storage circuit 12 of the preceding stage belonging to the memory area B. In contrast, if state 1 (S1) shown in FIG. 2 is employed for the memory area B, the selective storage circuit 12 for state 1 of the $j-1^{th}$ stage is connected only to the selective storage circuits 12 for state 2 and state 3 of the $j^{th}$ stage, whereby it will be necessary to newly provide a path for the connection to the selective storage circuit 12 for state 1. This similarly applies to the third embodiment.

Fourth Embodiment

Figure 11:
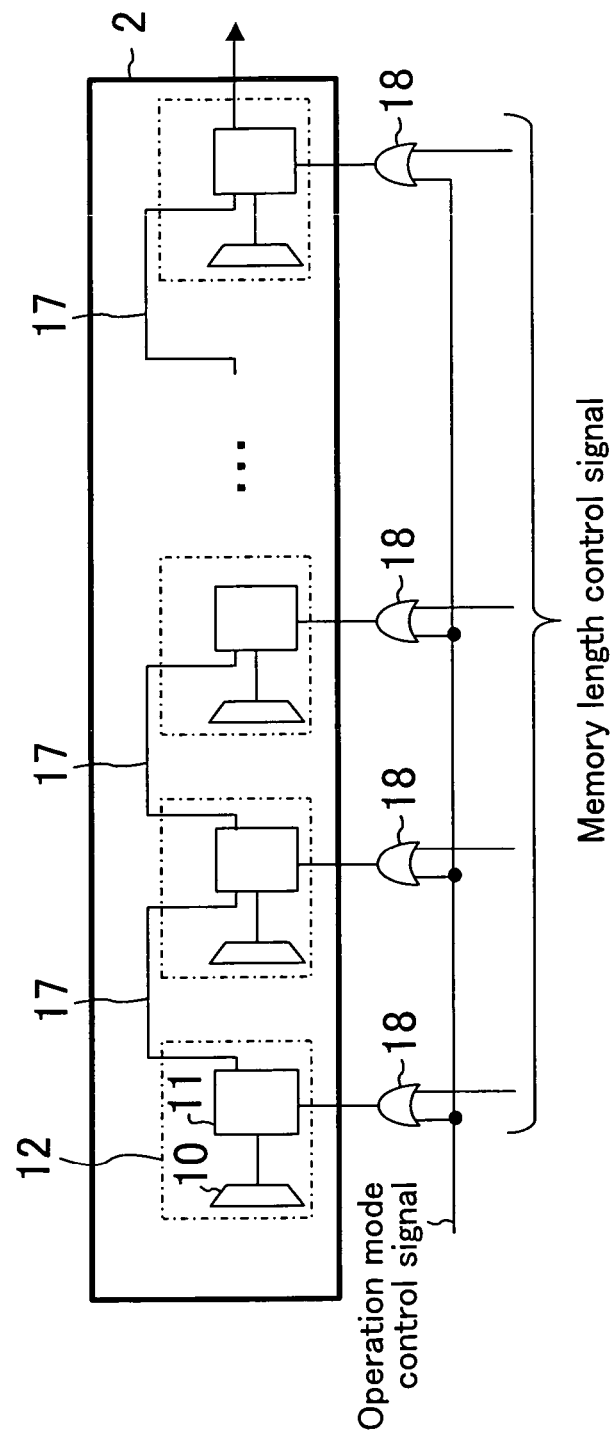
FIG. 11 is a block diagram showing a path memory circuit according to a fourth embodiment of the present invention.

FIG. 11 shows a configuration of the memory area B in a fourth embodiment. In FIG. 11, reference numeral 17 denotes a scan path, and reference numeral 18 denotes an operation mode control circuit. The memory area A and the memory area C are not shown in FIG. 11.

Figure 12:
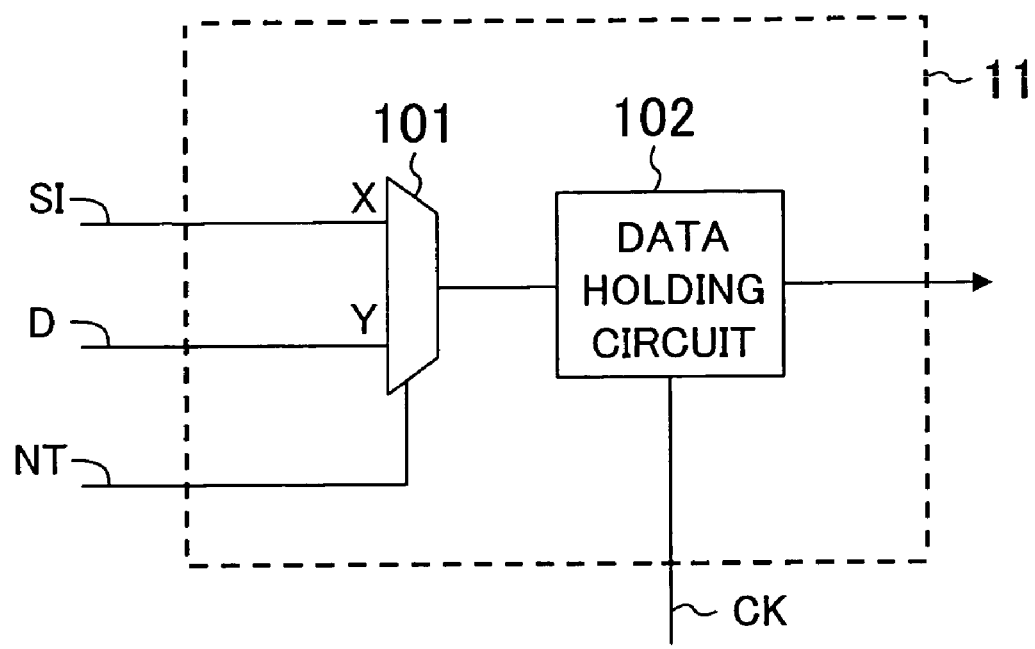
FIG. 12 is a circuit diagram showing an example of a configuration of the storage element circuit shown in FIG. 11.

Typically, a data holding circuit such as a flip-flop includes a scan test circuit for the chip inspection. FIG. 12 shows a data holding circuit with a scan function. In FIG. 12, reference numeral 101 denotes a selection circuit that selects a normal input (D) when the mode selection signal (NT) is at L and selects a test input (SI) when it is at H, and reference numeral 102 denotes a data holding circuit for holding and outputting the input signal in synchronism with the clock signal (CK).

Such data holding circuits with a scan function are used as the storage element circuits 11 in the memory area B, and the scan paths 17 are provided so as to connect together all the storage element circuits 11 in the memory area B in an ascending order from the $i^{th}$ stage to the $M^{th}$ stage. In each stage, the output signal of the operation mode control circuit 18 is inputted to NT of the selection circuit 101 in the storage element circuit 11. The operation mode control circuit 18 outputs the input operation mode control signal when the memory length control signal is at L, and outputs a signal fixed to H when the memory length control signal is at H.

With such a configuration, when the $j^{th}$ and subsequent stages are stopped by the memory length control signal, the storage element circuits 11 in the memory area B of the $j^{th}$ and subsequent stages operate in a scan mode. Specifically, each storage element circuit 11 receives the output from the preceding storage element circuit 11 via the scan path 17, which is repeated to the storage element circuit 11 of the $M^{th}$ stage.

In this configuration, if a typical flip-flop with a scan function is used as the storage element circuit 11, it is necessary to input the clock signal even to stages where the operation is stopped in the memory area B. However, if the storage element circuit 11 of the second embodiment shown in FIG. 7 or 8 is used as the data holding circuit 102 shown in FIG. 12, it is not necessary to supply the clock signal.

In addition, with the configuration of FIG. 11, the efficiency of the circuit configuration will be the same, no matter what state the selective storage circuit 12 used in the memory area B is for.

The present embodiment may also employ a configuration where the synchronous-type selective storage element circuits 15 and the repeater-type selective storage element circuits 14 coexist, as in the third embodiment.

While it is stated in the fourth embodiment that the selective storage circuit 12 for any state may be employed for the memory area B, distribution of the memory length control signal, the operation mode control signal, the clock signal, etc., is easier if the layout is such that each memory area is provided within a single area not overlapping with one another. Thus, in practice, it is preferred to employ an arrangement in which a row of the selective storage circuits 12 at the top or the bottom of the arrangement forms the memory area B, as shown in FIG. 4.

INDUSTRIAL APPLICABILITY

The path memory circuit of the present invention is characteristic in that it realizes a variable memory length function while suppressing the increase in the circuit scale, and is useful as an error correction technique in the read channel system of communications systems, optical discs and magnetic disks.

What is claimed is:

1. A path memory circuit for use in a Viterbi decoding process performed based on state transitions through a number n (n is a positive integer) of states, comprising M (M is a positive integer) stages of storage circuits, each storage circuit including n rows of selective storage circuits, each selective storage circuit including a selection circuit for selectively outputting an input according to a result of the Viterbi decoding and a storage element circuit for storing a result selectively outputted from the selection circuit, the path memory circuit comprising:

a memory area A formed by the storage circuits of the first to $i^{th}$ (i is an integer from 0 to M) stages;

a memory area B formed by the selective storage circuits that select and hold a decoding result for any state k (k is an integer from 1 to n) of the storage circuits from the $i+1^{th}$ stage to the $M^{th}$ stage; and a memory area C formed by the selective storage circuits other than the memory area A and the memory area B, wherein according to a memory length control signal, the storage circuits of the j (j is an integer from i+1 to M)$^{th}$ and subsequent stages in the memory area C are stopped, and the selection circuits of the $j^{th}$ and subsequent stages in the memory area B select an output of the selective storage circuits of a preceding storage circuit belonging to the memory area B.

2. The path memory circuit of claim 1, further comprising: memory length setting means for setting, to a first state, the memory length control signal to the storage circuit of a stage so as to set a path memory length to an intended length depending on a status of a signal to be Viterbi-decoded; and logical sum means for, when the memory length control signal to the storage circuit of a stage is set to the first state, setting, to the first state, the memory length control signal to the storage circuit of the following stage.

3. The path memory circuit of claim 1, further comprising:

convergence determination means for, when it is determined that outputs from all the storage element circuits of a stage are equal to one another, setting, to a first state, the memory length control signal to the storage circuit of the following stage; and logical sum means for, when the memory length control signal to the storage circuit of a stage is set to the first state, setting, to the first state, the memory length control signal to the storage circuit of the following stage.

4. The path memory circuit of claim 1, wherein when the storage circuits of the $j^{th}$ and subsequent stages in the memory area C are stopped according to the memory length control signal, each of the storage element circuits of the $j^{th}$ and subsequent stages in the memory area B outputs its input signal as it is, irrespective of a clock signal.

5. The path memory circuit of claim 4, wherein the storage element circuit in the memory area B includes:

data holding means for taking in an input signal when a synchronization pulse signal is in a first state and for holding the input signal when the synchronization pulse signal is in a second state; and synchronization pulse producing means, receiving a synchronization signal and a control signal as its inputs, for outputting the synchronization pulse signal in the first state when the control signal is in the first state and for producing a pulse signal from the synchronization signal and outputting the produced pulse signal as the synchronization pulse signal when the control signal is in the second state, wherein the memory length control signal is used as the control signal of the synchronization pulse producing means.

6. The path memory circuit of claim 4, wherein the storage element circuit in the memory area B includes:

master storage means for holding an input signal when a first synchronization signal is in a first state and for taking in the input signal when the first synchronization signal is in a second state;

slave storage means for taking in an output of the master storage means when a second synchronization signal is in the first state and for holding the output when the second synchronization signal is in the second state; and synchronization signal producing means, receiving a synchronization signal and a control signal as its inputs, for outputting the synchronization signal as the first synchronization signal, for outputting an inverted version of the synchronization signal as the second synchronization signal when the control signal is in the first state, and for outputting the synchronization signal as it is as the second synchronization signal when the control signal is in the second state, wherein the memory length control signal is used as the control signal of the synchronization signal producing means.

7. The path memory circuit of claim 4, wherein each storage element circuit in the memory area B is a latch circuit, the path memory circuit further comprising:

synchronization pulse producing means for producing a pulse signal from a received synchronization signal and outputting the produced pulse signal; and a driver circuit, receiving an output from the synchronization pulse producing means and the memory length control signal, for outputting a signal in a first state when the memory length control signal is in the first state, and for outputting an output from the synchronization pulse producing means when the memory length control signal is in the second state, wherein an output signal from the driver circuit is given as a synchronization signal to the memory area B.

8. The path memory circuit of claim 1, wherein the memory area B includes:

a synchronous-type selective storage circuit for holding and outputting an input in synchronism with a clock signal when the memory length control signal is in a first state;

a repeater-type storage element circuit for outputting an input signal as it is, irrespective of the clock signal, when the memory length control signal is in the first state.

9. The path memory circuit of claim 1, wherein:

each storage element circuit in the memory area B includes a circuit for a scan test, and a scan path is formed by connecting together the storage element circuits in an order starting from the $i+1^{th}$ stage to the $M^{th}$ stage; and the storage element circuits of the $j^{th}$ and subsequent stages in the memory area B operate in a scan test mode when the storage circuits of the $j^{th}$ and subsequent stages in the memory area C are stopped according to the memory length control signal.

10. The path memory circuit of claim 1, wherein groups of circuit elements forming the memory area A, the memory area B and the memory area C are each placed in a single independent area, with the memory area B corresponding to a first row or an $n^{th}$ row of the memory area A and being positioned next to that row of the memory area A.

11. The path memory circuit of claim 1, wherein the memory area B is formed by the selective storage circuits belonging to such a state that one input of the selection circuit is an output from the selective storage circuit of the same state for one time segment ago.

12. The path memory circuit of claim 1, wherein when the $j^{th}$ and subsequent stages of the memory area C are stopped, a supply of a clock signal to the $j^{th}$ and subsequent stages of the memory area C is stopped.

13. The path memory circuit of claim 12, wherein when the $j^{th}$ and subsequent stages of the memory area C are stopped, a back bias is applied to a substrate of transistors included in the $j^{th}$ and subsequent stages of the memory area C.

14. The path memory circuit of claim 1, wherein when the $j^{th}$ and subsequent stages of the memory area C are stopped, a power supply to the $j^{th}$ and subsequent stages of the memory area C is stopped.

* * * * *